(12) United States Patent
Ohse et al.

(10) Patent No.: US 11,233,124 B2
(45) Date of Patent: Jan. 25, 2022

(54) SILICON CARBIDE SEMICONDUCTOR DEVICE AND MANUFACTURING METHOD FOR SILICON CARBIDE SEMICONDUCTOR DEVICE

(71) Applicant: FUJI ELECTRIC CO., LTD., Kawasaki (JP)

(72) Inventors: Naoyuki Ohse, Matsumoto (JP); Makoto Utsumi, Matsumoto (JP); Yasuhiko Oonishi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 298 days.

(21) Appl. No.: 15/796,890

(22) Filed: Oct. 30, 2017

(65) Prior Publication Data
US 2018/0138274 A1    May 17, 2018

(30) Foreign Application Priority Data

Nov. 16, 2016    (JP) .............................. JP2016-223539

(51) Int. Cl.
*H01L 29/16*    (2006.01)
*H01L 21/04*    (2006.01)
(Continued)

(52) U.S. Cl.
CPC .... *H01L 29/1608* (2013.01); *H01L 21/02378* (2013.01); *H01L 21/02529* (2013.01);
(Continued)

(58) Field of Classification Search
CPC .. H01L 29/1608; H01L 29/0878; H01L 29/36
(Continued)

(56) References Cited

U.S. PATENT DOCUMENTS

2002/0195656 A1* 12/2002 Hattori ............... H01L 29/7397
257/330
2010/0193796 A1* 8/2010 Nakano .................. H01L 29/45
257/66
(Continued)

FOREIGN PATENT DOCUMENTS

JP    2010087397 A    4/2010
JP    2012191056 A    10/2012
(Continued)

OTHER PUBLICATIONS

"Power Electronics Inverter Fundamental Technology Development Project", (Ex-post Appraisal) Sectional Meeting No. 1, Reference 5-2 (2), on the Internet [http://www.nedo.go.jp/content/100095428.pdf], retrieved on Nov. 1, 2016; English translation of the relevant parts: p. 17/27 and 18/27.

*Primary Examiner* — Thao X Le
*Assistant Examiner* — Laura M Dykes
(74) *Attorney, Agent, or Firm* — Rabin & Berdo, P.C.

(57) ABSTRACT

A silicon carbide semiconductor device includes plural p-type silicon carbide epitaxial layers provided on an $n^+$-type silicon carbide substrate. In some of the p-type silicon carbide epitaxial layers, an $n^+$ source region is provided in at least a region of an upper portion. The $n^+$ source region includes a first portion that contains arsenic and a second portion that contains phosphorous.

14 Claims, 11 Drawing Sheets

(51) Int. Cl.
- *H01L 29/167* (2006.01)
- *H01L 29/32* (2006.01)
- *H01L 29/78* (2006.01)
- *H01L 29/423* (2006.01)
- *H01L 29/739* (2006.01)
- *H01L 29/66* (2006.01)
- *H01L 21/02* (2006.01)
- *H01L 29/36* (2006.01)
- *H01L 29/06* (2006.01)
- *H01L 29/10* (2006.01)

(52) U.S. Cl.
CPC ...... *H01L 21/02634* (2013.01); *H01L 21/046* (2013.01); *H01L 29/0623* (2013.01); *H01L 29/1095* (2013.01); *H01L 29/167* (2013.01); *H01L 29/32* (2013.01); *H01L 29/36* (2013.01); *H01L 29/4236* (2013.01); *H01L 29/66068* (2013.01); *H01L 29/66333* (2013.01); *H01L 29/66666* (2013.01); *H01L 29/7395* (2013.01); *H01L 29/7397* (2013.01); *H01L 29/7813* (2013.01); *H01L 29/7827* (2013.01)

(58) Field of Classification Search
USPC .......................................................... 257/77
See application file for complete search history.

(56) References Cited

U.S. PATENT DOCUMENTS

| | | | |
|---|---|---|---|
| 2011/0175111 A1* | 7/2011 | Harada | H01L 21/0485 257/77 |
| 2012/0313162 A1* | 12/2012 | Matsuda | H01L 21/2254 257/330 |
| 2014/0353683 A1 | 12/2014 | Ishimabushi et al. | |
| 2015/0034974 A1* | 2/2015 | Nishio | H01L 29/36 257/77 |
| 2015/0162411 A1* | 6/2015 | Schulze | H01L 21/76877 257/409 |
| 2016/0247910 A1* | 8/2016 | Suzuki | H01L 29/66068 |
| 2017/0271507 A1* | 9/2017 | Suzuki | H01L 29/1608 |

FOREIGN PATENT DOCUMENTS

| | | |
|---|---|---|
| JP | 2014236120 A | 12/2014 |
| JP | 2015032674 A | 2/2015 |

\* cited by examiner

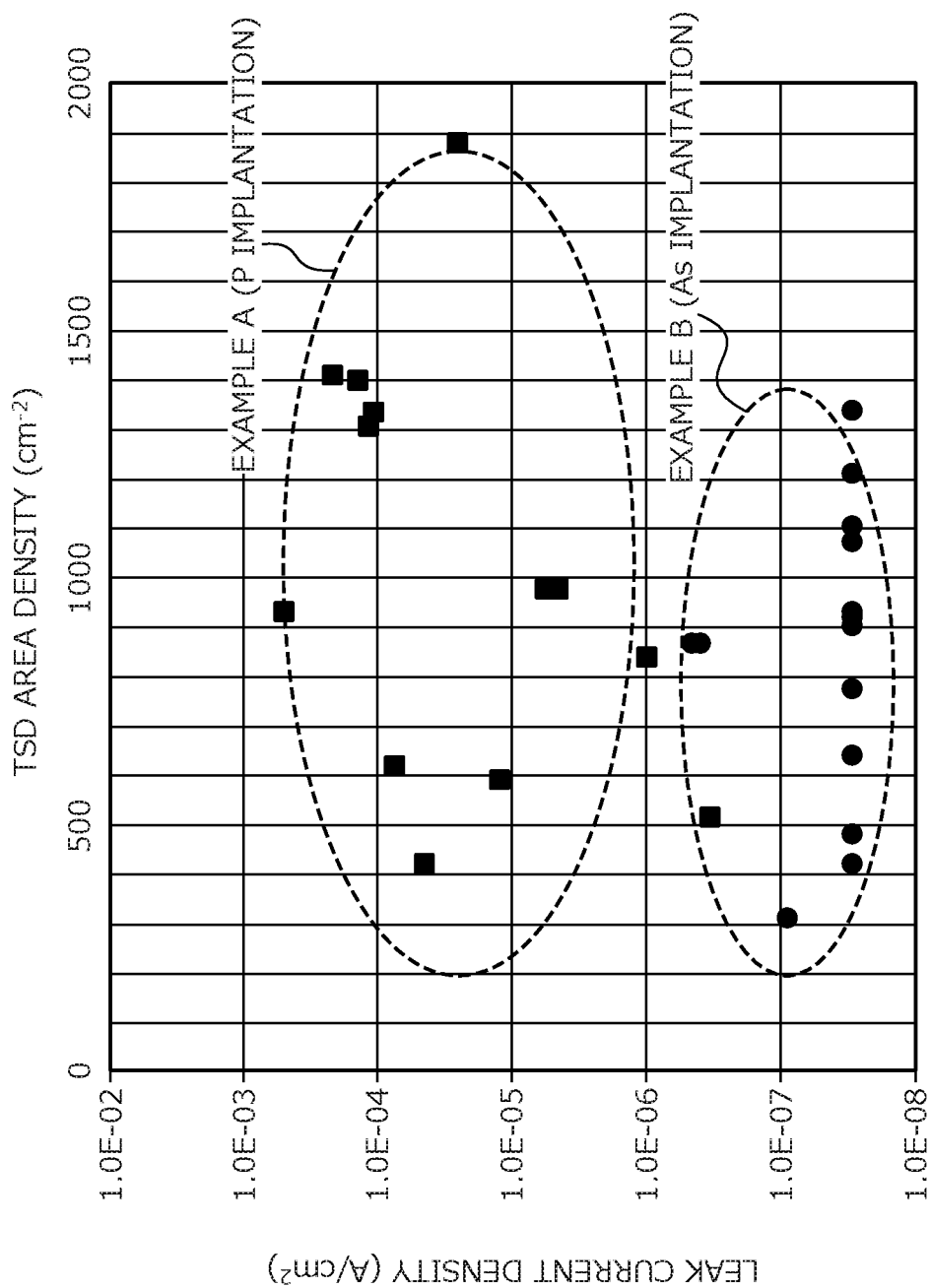

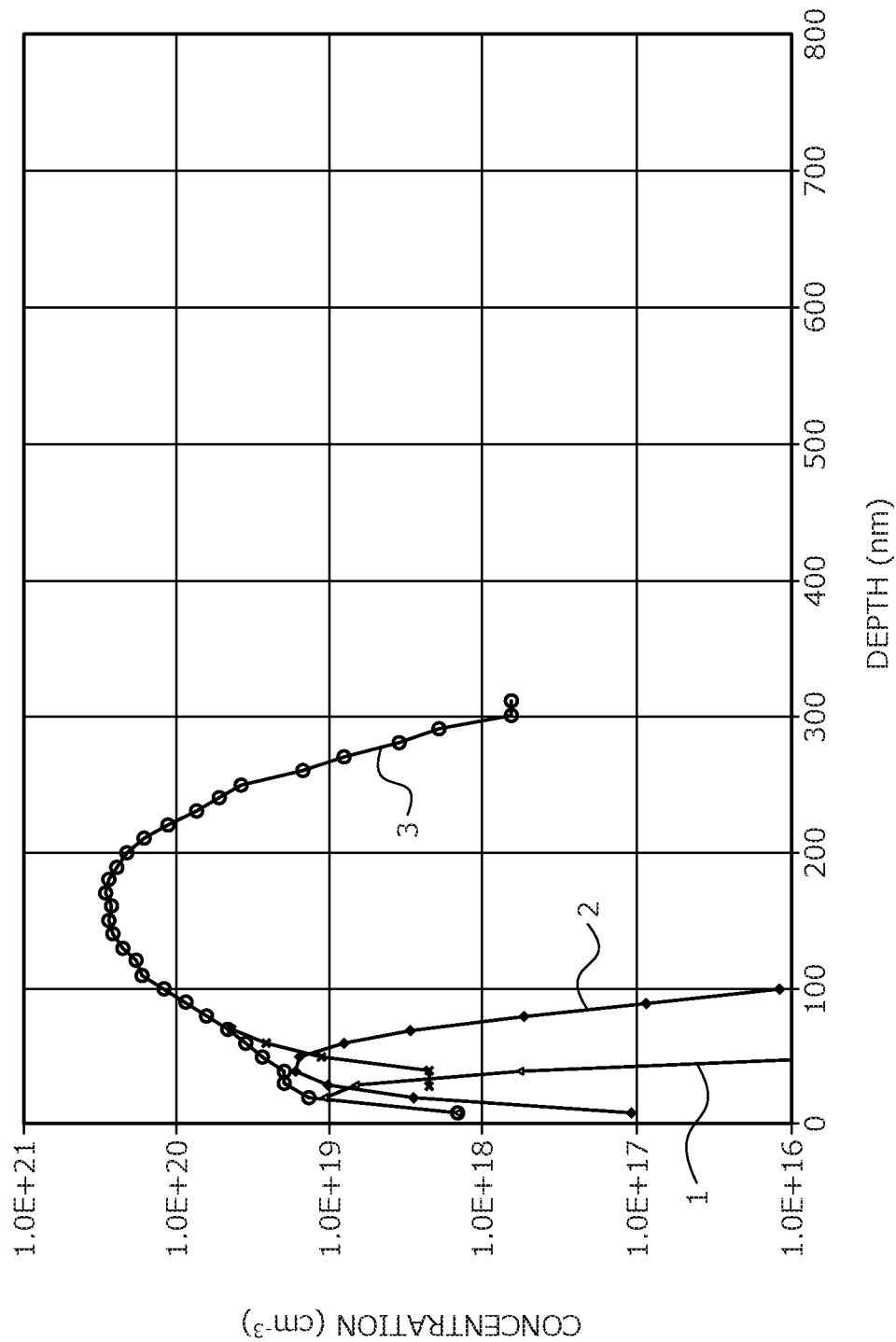

SILICON CARBIDE SEMICONDUCTOR DEVICE AND MANUFACTURING METHOD FOR SILICON CARBIDE SEMICONDUCTOR DEVICE

CROSS REFERENCE TO RELATED APPLICATIONS

This application is based upon and claims the benefit of priority of the prior Japanese Patent Application No. 2016-223539, filed on Nov. 16, 2016, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) has recently drawn attention as a semiconductor material to replace silicon (Si). SiC has a high bandgap of 3.25 eV for 4H—SiC, substantially three times the bandgap of Si (1.12 eV), thereby enabling a high upper limit operating temperature to be set. The critical electric field strength of 4H—SiC is 3.0 MV/cm, substantially ten times the critical electric field strength of Si (0.25 MV/cm). The on-resistance, which is the inverse of the cube of the critical electric field strength, may be reduced and power loss in the steady state may also be reduced. The thermal conductivity of 4H—SiC is high at 4.9 W/cmK, more than a three-fold value of the thermal conductivity of Si (1.5 W/cmK), whereby a large heat cooling effect is achieved. As a result, the size of a cooling apparatus may be reduced. In addition, SiC has a high saturated drift velocity of $2 \times 10^7$ cm/s and is excellent for the high speed operation. Thus, SiC is expected to be applied to power semiconductor elements (hereinafter, referred to as "power devices"), high frequency devices, devices operating under high temperatures, and the like.

At present, trial devices such as a MOSFET, a pn-diode, and a Schottky diode manufactured using SiC and devices having properties exceeding those of Si in terms of breakdown voltage and on-resistance (=the forward voltage/the forward current, during energization) appear one after another. To manufacture these elements, a technique of controlling the conductivity type and the carrier concentration of a selected region is necessary, and thermal diffusion and ion implantation are such techniques. Although thermal diffusion is widely used for Si semiconductor elements, it is difficult to apply to SiC because the diffusion coefficient of an impurity is very small in SiC.

Therefore, ion implantation is usually used for SiC. As the ion species to be implanted, nitrogen (N) or phosphorus (P) is used for an n-type impurity and aluminum (Al) or boron (B) is often used for a P-type impurity.

A large-capacity, high voltage power device has a vertical element structure in which current flows in the vertical direction of the element, i.e., from the surface of the element to the back surface thereof and in which voltage is applied between the surface and the back surface. As a result, this power device is configured to include an electrode on the surface and on the back surface of the semiconductor element. For example, the Schottky diode is configured to include a Schottky electrode on the surface of the element and an ohmic electrode on the back surface (a second main surface) thereof. The vertical MOSFET is configured to include a source electrode and a gate electrode on the surface of the substrate and a drain electrode to be an ohmic electrode on the back surface thereof.

On the other hand, it has been reported that a SiC substrate includes many types of defects that are formed in the course of production, and some of the defects contribute to leak current in a MOS device (see, e.g., "Power Electronics Inverter Fundamental Technology Development Project" (Ex-post Appraisal) Sectional Meeting No. 1, Reference 5-2 (2), on the Internet [http://www.nedo.go.jp/content/100095428.pdf], retrieved Nov. 1, 2016).

SUMMARY OF THE INVENTION

According to an embodiment a silicon carbide semiconductor device includes an n-type silicon carbide region in at least a region of an upper portion of a p-type silicon carbide region provided on an n-type silicon carbide substrate. The n-type silicon carbide region on the p-type silicon carbide region whose impurity concentration is equal to or lower than $1.0 \times 10^{18}$ cm$^{-3}$, among a plurality of the p-type silicon carbide regions, contains arsenic.

In the embodiment, the p-type silicon carbide region is formed by an epitaxial growth method.

In the embodiment, an arsenic concentration of the n-type semiconductor region is $1.0 \times 10^{19}$ cm$^{-3}$ to $5.0 \times 10^{20}$ cm$^{-3}$.

In the embodiment, an arsenic concentration of the n-type semiconductor region is high on a surface side and tends to decrease in a depth direction.

In the embodiment, an arsenic concentration of the n-type semiconductor region is low on a surface side and tends to increase in a depth direction.

In the embodiment, the n-type semiconductor region on a threading screw dislocation of the n-type silicon carbide substrate contains arsenic.

In the embodiment, an area density of the threading screw dislocation of the n-type silicon carbide substrate is 1/cm$^2$ to 3000/cm$^2$.

In the embodiment, the silicon carbide semiconductor device is a vertical MOSFET; the p-type silicon carbide region is a channel region; and the n-type silicon carbide region is a source region.

In the embodiment, the silicon carbide semiconductor device is a trench MOSFET.

In the embodiment, the silicon carbide semiconductor device is a vertical IGBT; the p-type silicon carbide region is a channel region; and the n-type silicon carbide region is an emitter region.

In the embodiment, the silicon carbide semiconductor device is a trench IGBT.

According to another embodiment, a method of manufacturing a silicon carbide semiconductor device includes forming a p-type silicon carbide region on an n-type silicon carbide substrate; and forming an n-type silicon carbide region in at least a region of an upper portion of the p-type silicon carbide region. Some of the p-type silicon carbide regions are formed to have an impurity concentration equal to or lower than $1.0 \times 10^{18}$ cm$^{-3}$. The n-type silicon carbide region on the p-type silicon carbide region is formed by ion implantation using arsenic.

In the embodiment, the p-type silicon carbide region is formed by an epitaxial growth method.

In the embodiment, a concentration of arsenic of the n-type silicon carbide region is $1 \times 10^1$ cm$^{-3}$ to $5 \times 10^{20}$ cm$^{-3}$.

In the embodiment, the n-type silicon carbide region on a threading screw dislocation of the n-type silicon carbide substrate is formed containing arsenic.

In the embodiment, an area density of threading screw dislocations of the n-type silicon carbide substrate is $1/cm^2$ to $3000/cm^2$.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a graph of leak current in a MOSFET manufactured according to the first embodiment;

FIG. 6 is a graph of concentration profiles of As of a silicon carbide semiconductor device according to a fifth embodiment.

DETAILED DESCRIPTION OF THE INVENTION

Figure 1:
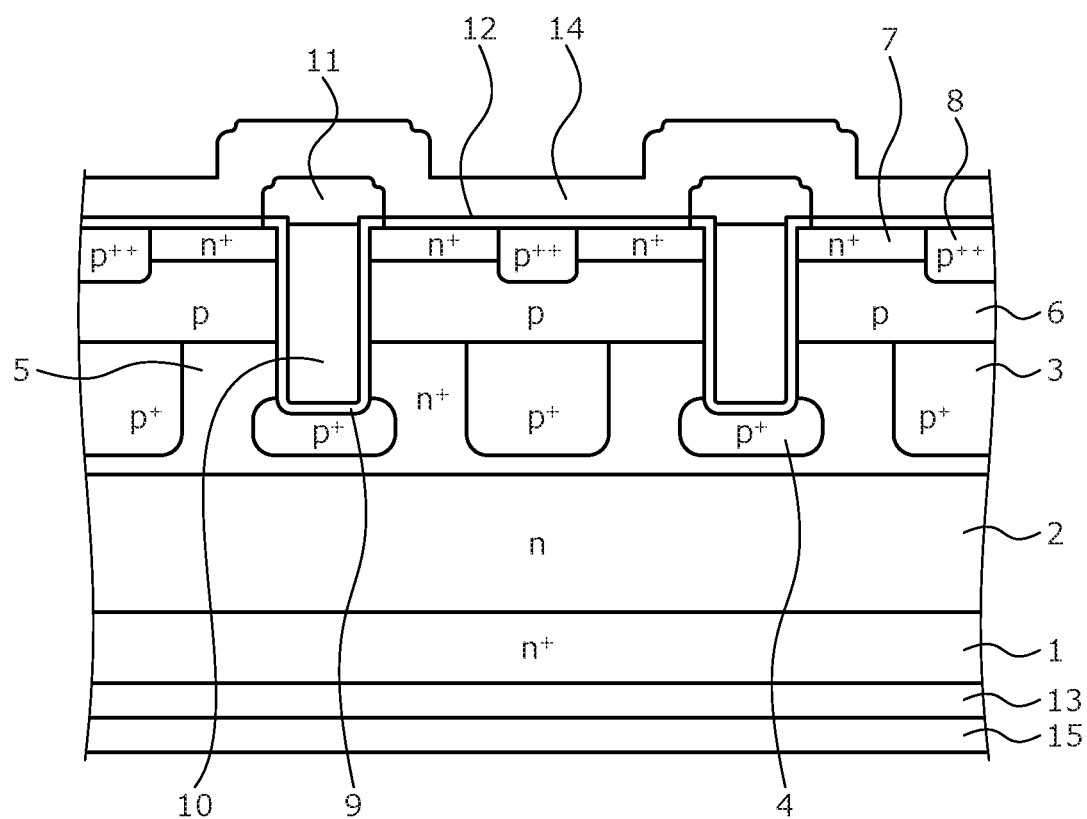
FIG. 1 is a cross-sectional view of a configuration of a silicon carbide semiconductor device according to a first embodiment.

The inventors produced a diode using a 4H—SiC substrate and confirmed that leak current was generated even in the above conventional diode similar to the above non-patent literature. At present, no reduction in leak current can be achieved in a SiC substrate in which a predetermined defect type such as, for example, a threading screw dislocation (TSD) has been generated.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or – appended to n or p means that the impurity concentration is higher or lower, respectively, than layers and regions without + or –. Cases where symbols such as n's and p's that include + or – are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "–" means a bar added to an index immediately after the "–", and a negative index is expressed by prefixing "–" to the index. In the embodiments, a first conductivity type is assumed to be an n-type and a second conductivity type is assumed to be a p-type.

To confirm the effect of the present invention, the inventors conducted the following experiment and derived the results below. The semiconductor device according to the present invention includes a wide bandgap semiconductor. In the following embodiments, a semiconductor device manufactured using, for example, silicon carbide (SiC) as the wide bandgap semiconductor, i.e., a silicon carbide semiconductor device will be described taking a MOSFET as an example.

FIG. 1 is a cross-sectional view of a configuration of a silicon carbide semiconductor device according to a first embodiment. As depicted in FIG. 1, the silicon carbide semiconductor device according to the first embodiment has an n-type silicon carbide epitaxial layer (a wide bandgap semiconductor deposition layer) 2 deposited on a first main surface such as, for example, a (0001) surface (an Si surface) of a silicon carbide substrate (a wide bandgap semiconductor substrate) 1 of an $n^+$-type that is the first conductivity type. The $n^+$-type silicon carbide substrate 1 is a silicon-carbide single crystal substrate doped with, for example, nitrogen (N). The n-type silicon carbide epitaxial layer 2 is a low concentration n-type drift layer doped with, for example, nitrogen and having an impurity concentration lower than that of the $n^+$-type silicon carbide substrate 1. A high concentration n-type ($n^+$) region 5 is formed on the first main surface side of the n-type silicon carbide epitaxial layer 2, and the high-concentration n-type region 5 is doped with, for example, nitrogen and has an impurity concentration that is lower than that of the $n^+$-type silicon carbide substrate 1 and that is higher than that of the n-type silicon carbide epitaxial layer 2. Hereinafter, the $n^+$-type silicon carbide substrate 1 alone, the $n^+$-type silicon carbide substrate 1 and the n-type silicon carbide epitaxial layer 2, or the $n^+$-type silicon carbide substrate 1, the n-type silicon carbide epitaxial layer 2, and a p base region described later will be collectively referred to as a "silicon carbide semiconductor device base substrate".

As depicted in FIG. 1, a rear electrode 13 is provided on the main surface of $\phi 2$ of the $n^+$-type silicon carbide substrate 1 (back surface of the silicon carbide semiconductor device base substrate). The rear electrode 13 constitutes a drain electrode.

A trench structure is formed on the first main surface side of the silicon carbide semiconductor device base substrate. For example, the trench structure penetrates a p-type wide-bandgap layer 6 from the surface on a first side of the p-type wide-bandgap layer 6 of the second conductivity type (a p-type) (the first main surface side of the silicon carbide semiconductor device base substrate) opposite a second side thereof facing toward the $n^+$-type silicon carbide substrate 1, the trench structure reaching the n-type silicon carbide epitaxial layer 2. Along the surface of a trench, a gate insulating film 9 is formed on a bottom portion and a side portion of the trench. A gate electrode 10 insulated from the n-type silicon carbide epitaxial layer 2 and the p-type wide-bandgap layer 6 by the gate insulating film 9 is formed inside the trench. A portion of the gate electrode 10 may protrude externally from the trench.

A first p ($p^+$) base region 3 of the second conductivity type (a first semiconductor region of the second conductivity type) and a second p ($p^{3o}$) base region 4 are selectively provided in the surface layer on a first side of the n-type silicon carbide epitaxial layer 2 (the first main surface side of the silicon carbide semiconductor device base substrate) opposite a second side thereof facing the $n^+$-type silicon carbide substrate 1. The second p base region 4 is formed beneath the trench. The first p base region 3 and the second p base region 4 are each doped with, for example, aluminum. The structure may be such that a portion of the first p base region 3 extends toward the trench to thereby be connected to the second p base region 4.

The p-type wide-bandgap layer 6 is provided on the first main surface side of the n-type silicon carbide epitaxial layer 2, and an n$^+$-type source region 7 and a p$^{++}$-type contact region 8 are provided on the first main surface side of the p-type wide-bandgap layer 6. The n$^+$-type source region 7 and the p$^{++}$-type contact region 8 contact each other. High-concentration n-type regions 5 are provided in a region between the first p base region 3 and the second p base region 4 in the surface layer of the n-type silicon carbide epitaxial layer 2 and a region between the p-type wide-bandgap layer 6 and the second p base region 4.

Although FIG. 1 depicts only two trench MOS structures, more trench MOS structures may be arranged parallel to each other.

An interlayer insulating film 11 is provided on the overall surface on the first main surface side of the silicon carbide semiconductor device base substrate so as to cover the gate electrode 10 embedded in the trench. A source electrode 12 contacts the n$^+$-type source region 7 and the p$^{++}$-type contact region 8 through a contact hole opened in the interlayer insulating film 11. The source electrode 12 is electrically insulated from the gate electrode 10 by the interlayer insulating film 11. An electrode pad 14 is provided on the source electrode 12.

Figure 2A:
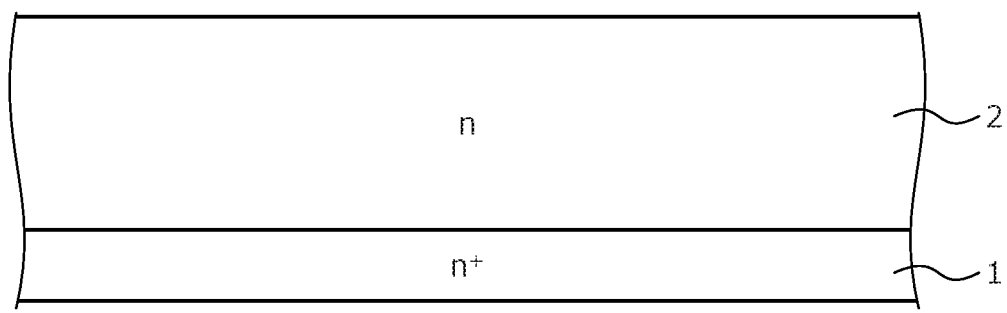
FIGS. 2A, 2B, 2C, 2D, 2E, 2F, and 2G are cross-sectional views of the semiconductor device according to the first embodiment during manufacture.

FIGS. 2A, 2B, 2C, 2D, 2E, 2F, and 2G are cross-sectional views of the semiconductor device according to the first embodiment during manufacture. As depicted in FIG. 2A, the first silicon carbide epitaxial layer 2 doped with an n-type impurity such as nitrogen is formed on the first main surface of the n$^+$-type silicon carbide substrate 1 and has a thickness of, for example, 10 μm. The impurity concentration of the first silicon carbide epitaxial layer 2 may be set to be about $3 \times 10^{15}$/cm$^3$.

Figure 2B:
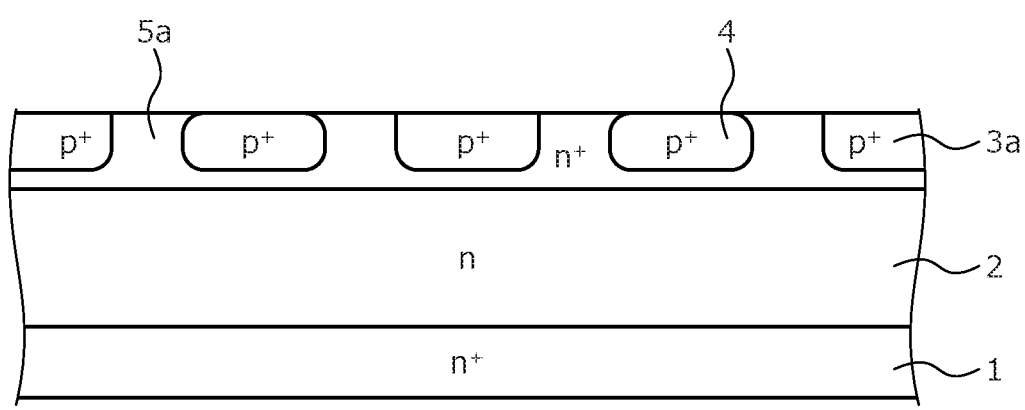

A silicon oxide film is deposited on the surface of the first silicon carbide epitaxial layer 2 by a method such as plasma CVD to have a thickness of 1.5 μm, and a mask for ion implantation and having a predetermined opening is formed by photolithography. As depicted in FIG. 2B, a p-type impurity such as aluminum is implanted in the opening of the silicon oxide film to form the p base region 4 at a depth of about 0.5 μm. The p base region 4 to be the bottom portion of the trench may be formed simultaneously with a p base region 3a. The impurity concentrations of the p base region 3a and the p base region 4 are each set to be, for example, about $5.0 \times 10^{18}$/cm$^3$. Although described later, the p base region 3 includes plural p base regions 3a and 3b that are stacked on each other. The p base region 3 is the first p base region 3 and the p base region 4 is the second p base region 4.

A portion of the mask for the ion implantation is removed and an n-type impurity such as nitrogen is ion implanted in the opening to form a high-concentration n-type region 5a at a depth of, for example, about 0.5 μm in a portion of the surface region of the first silicon carbide epitaxial layer 2. The impurity concentration of the high-concentration n-type region 5a is set to be, for example, about $1.0 \times 10^{17}$/cm$^3$.

Figure 2C:
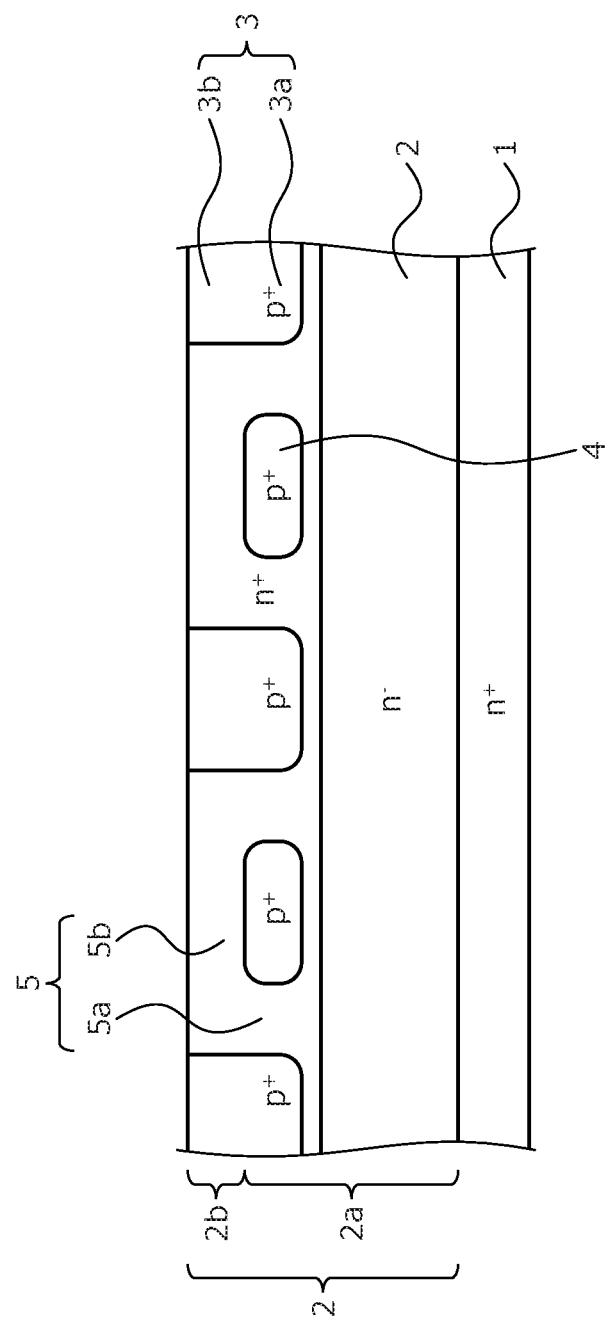

As depicted in FIG. 2C, a second silicon carbide epitaxial layer 2b doped with an n-type impurity such as nitrogen is formed on the surface of the first silicon carbide epitaxial layer 2 to have a thickness of about 0.5 μm. The impurity concentration of the second silicon carbide epitaxial layer 2b is set to be about $3.0 \times 10^{15}$/cm$^3$. In the description hereinafter, the first silicon carbide epitaxial layer 2 is positioned below and therefore, the first silicon carbide epitaxial layer 2 is formed by stacking the (upper) second silicon carbide epitaxial layer 2b on a lower first silicon carbide epitaxial layer 2a.

A silicon oxide film having a thickness of 1.5 μm is deposited on the surface of the second silicon carbide epitaxial layer 2 using a method such as plasma CVD, and a mask for ion implantation and having a predetermined opening is formed by photolithography. A p-type impurity such as aluminum (Al) is implanted in the opening of the silicon oxide film to form the p base region 3b at a depth of about 0.5 μm, superimposed on the p base region 3a. The p base regions 3a and 3b form a continuous region becoming the p base region 3. The impurity concentration of the p base region 3b is set to be, for example, about $5.0 \times 10^{18}$/cm$^3$.

A portion of the mask for the ion implantation is removed and an n-type impurity such as nitrogen is ion implanted in the opening to form a high-concentration n-type region 5b at a depth of, for example, about 0.5 μm in a portion of the surface region of the second silicon carbide epitaxial layer 1. The impurity concentration of the high-concentration n-type region 5b is set to be, for example, about $1.0 \times 10^{17}$/cm$^3$. The high-concentration n-type region 5b and the n-type region 5a are formed such that portions of each contact each other to form the high-concentration n-type region 5.

Figure 2D:
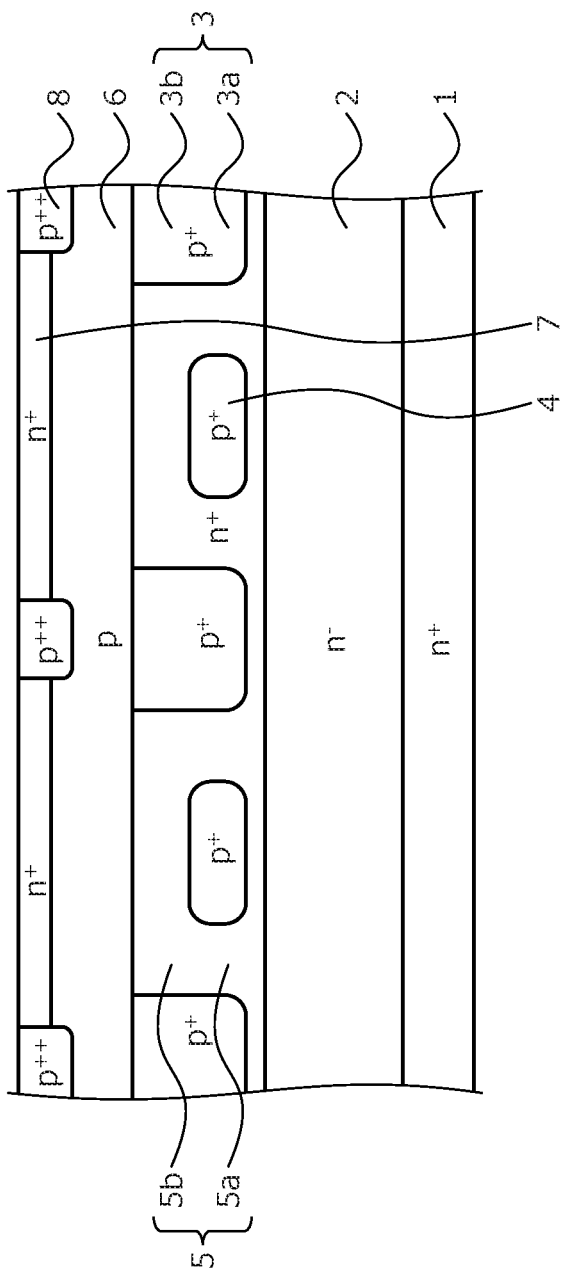

As depicted in FIG. 2D, a third silicon carbide epitaxial layer (the p-type wide-bandgap layer) 6 doped with a p-type impurity such as aluminum is formed on the surface of the second silicon carbide epitaxial layer 2 and has a thickness of about 1.3 μm. The impurity concentration of the third silicon carbide epitaxial layer 6 is set to be about $4.0 \times 10^{17}$/cm$^3$.

A photoresist is formed in a central portion of the element on the third silicon carbide epitaxial layer 6 by photolithography and is used as a mask to performed dry etching using a fluorine-based gas such as SF$_6$ to remove a periphery of the third silicon carbide epitaxial layer 6 to the depth of about 1.3 μm to produce a mesa.

As depicted in FIG. 2D, a silicon oxide film having a thickness of 1.5 μm is deposited on the surface of the third silicon carbide epitaxial layer 6 using a method such as plasma CVD, and a mask for ion implantation including a predetermined opening is formed by photolithography. An n-type impurity such as phosphorus is ion implanted in the opening to form the n$^+$-type source region 7 in a portion of the surface of the third silicon carbide epitaxial layer 6. The impurity concentration of the n$^+$ source region 7 is set to be higher than the impurity concentration of the third silicon carbide epitaxial layer 6.

After removing the mask for the ion implantation used in the formation of the n$^+$ source region 7, a mask for ion implantation including a predetermined opening is formed using the same method, and a p-type impurity such as aluminum is ion-implanted in a portion of the surface of the third silicon carbide epitaxial layer 6 to form the p$^{++}$ contact region 8. The impurity concentration of the p$^{++}$ contact region 8 is set to be higher than the impurity concentration of the third silicon carbide epitaxial layer 6.

A silicon oxide film having a thickness of 1.5 μm is deposited on the surface of the third silicon carbide epitaxial layer 6 and the mesa formation portion using a method such as plasma CVD, and a mask for ion implantation and having a predetermined opening is formed by photolithography. A p-type impurity such as aluminum is ion-implanted in the opening to form a breakdown voltage structure region having a low impurity concentration in the surface of the exposed second silicon carbide epitaxial layer 2. The breakdown voltage structure region may take a structure formed in a region on the outer side of the element from an end portion of the p base region 4 or a structure formed in a region on the outer side of the element from the side face of the mesa.

The silicon carbide semiconductor device manufactured by the above steps is heat treated in an inert gas atmosphere at about 1700 degrees C. as an activation process for the first p base region 3, a second p base region 4, the $n^+$ source region 7, and the $p^{++}$-type contact region 8. A silicon oxide film having a thickness of 1.5 μm is thereafter deposited on the surfaces of the third silicon carbide epitaxial layer 6 and the exposed second silicon carbide epitaxial layer 2 using a method such as plasma CVD, and a mask for forming the trench and having a predetermined opening is created by photolithography.

Figure 2E:
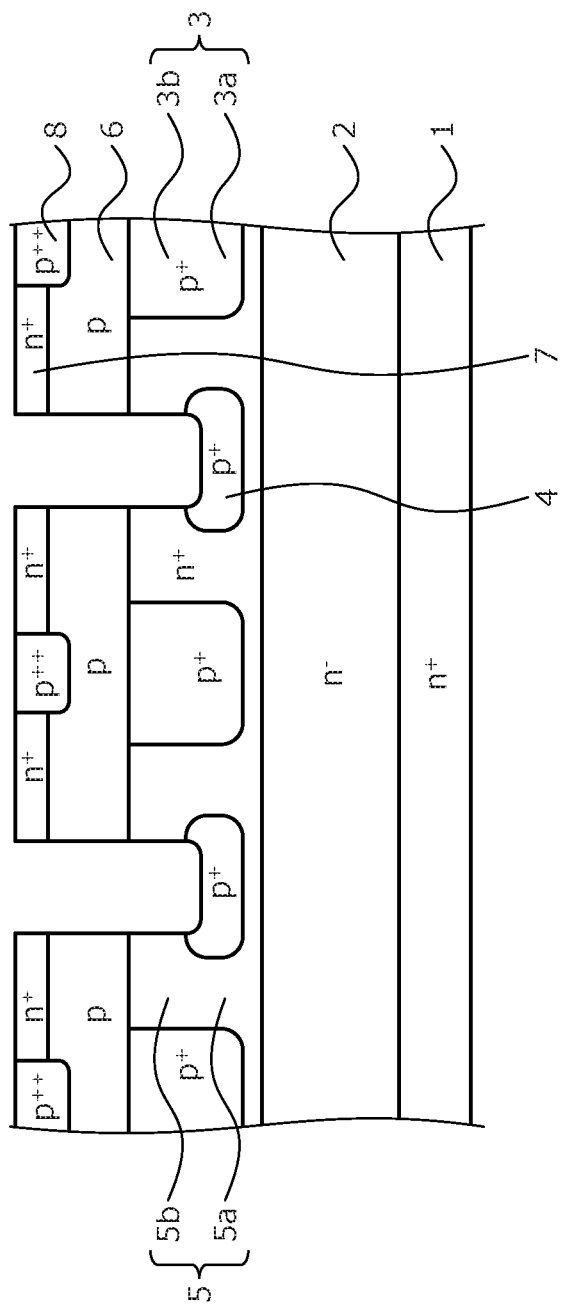

As depicted in FIG. 2E, the trench penetrating the third silicon carbide epitaxial layer 6 to reach the second silicon carbide epitaxial layer 2 is formed by dry etching. The bottom portion of the trench may reach the p base region 4 that is formed in the first silicon carbide epitaxial layer. The mask for forming the trench is removed.

An oxide film (for the trench portion, the gate insulating film 9) is formed on the bottom portion and the side portion of the trench along the surface of the trench. This oxide film may be formed by thermal oxidation by heat treatment at a temperature of about 1000 degrees C. in an oxygen atmosphere. This oxide film may also be deposited using the plasma CVD method or a vapor deposition method such as HTO.

Figure 2F:
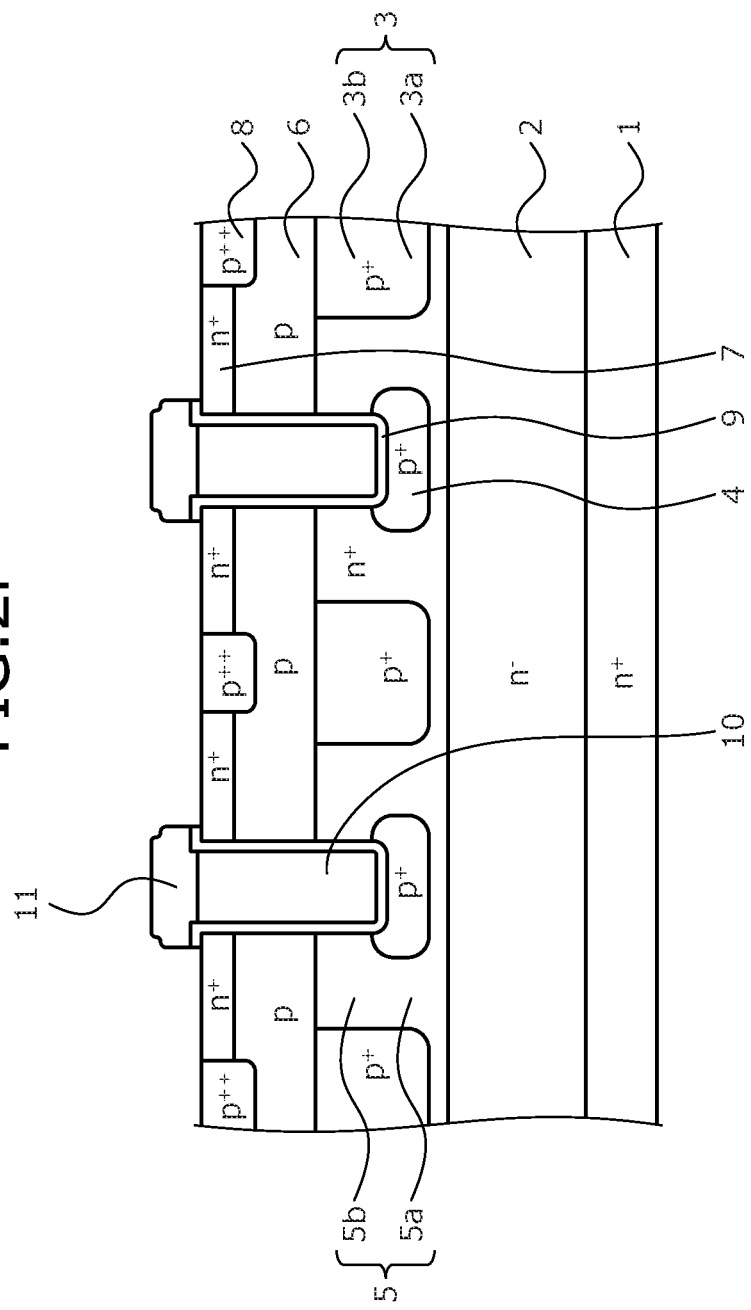

As depicted in FIG. 2F, a polysilicon layer doped with, for example, phosphorus atoms is formed on the gate insulating film 9. The polysilicon layer may be formed to fill the trench. The polysilicon layer is patterned by photolithography to cause the polysilicon to remain inside the trench. As a result, the gate electrode 10 is formed. A portion of the gate electrode 10 may externally protrude from the trench.

A film of, for example, phosphorus glass is formed to have a thickness of about 1 μm to cover the gate insulating film 9 and the gate electrode 10, forming the interlayer insulating film 11. The interlayer insulating film 11 and the gate insulating film 9 are patterned by photolithography to form a contact hole exposing the $n^+$ source region 7 and the $p^{++}$ contact region 8. Heat treatment (reflow) is thereafter performed to planarize the interlayer insulating film 11.

Figure 2G:
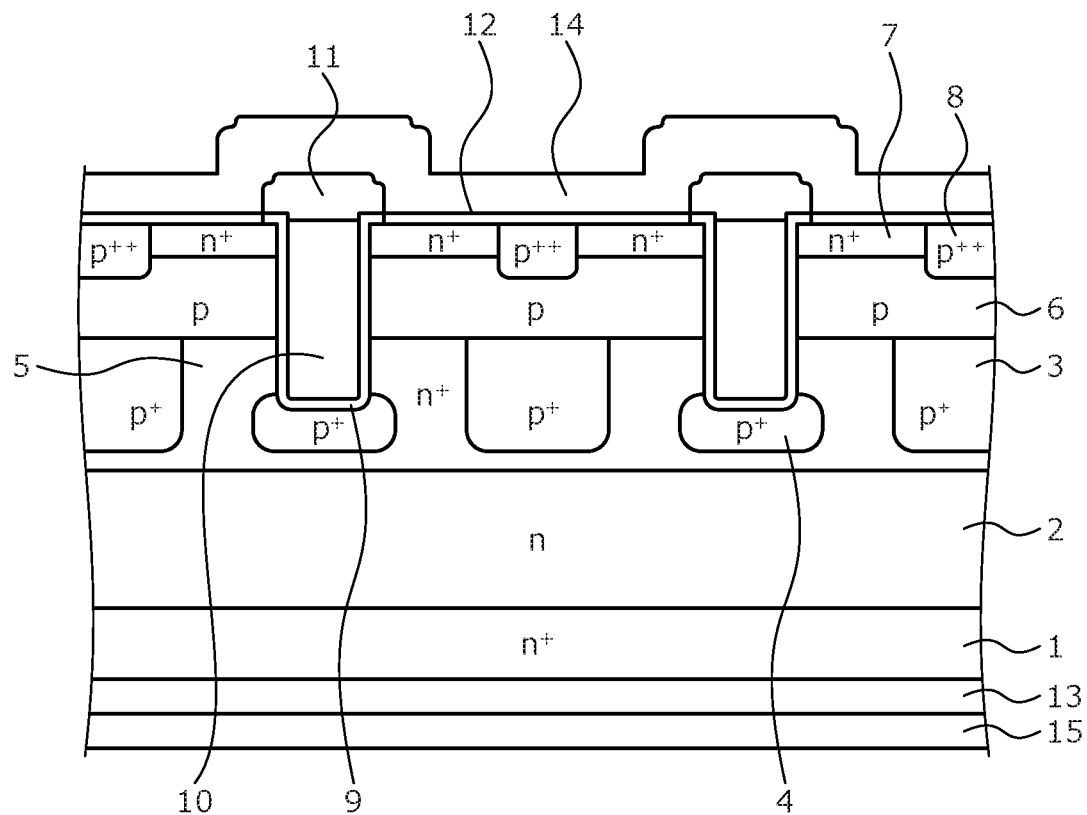

As depicted in FIG. 2G, a conductive film of Ni or the like to be the source electrode 12 is formed in the contact hole and on the interlayer insulating film 11. The conductive film is patterned by photolithography to cause the source electrode 12 to remain only in the contact hole.

The drain electrode 13 of nickel or the like is formed on the second main surface of the silicon carbide semiconductor device substrate 1. Heat treatment is executed thereafter in an inert gas atmosphere at about 1000 degrees C. to form the source contact electrode and the drain electrode that are in ohmic contact with the $n^+$ source region 7 and the $p^{++}$ contact region 8, and the silicon carbide semiconductor device substrate 1.

An aluminum film having a thickness of about 5 μm is deposited on the first main surface of the silicon carbide semiconductor device substrate 1 by a sputtering method, and the aluminum is removed by photolithography to cover the source electrode 12 and the interlayer insulating film 11 to form the electrode pad 14. A drain electrode pad 15 is formed by sequentially stacking, for example, titanium, nickel, and gold on the surface of the drain electrode 13. In this manner, the MOSFET depicted in FIG. 1 is completed.

FIG. 3 is a graph of leak current in the MOSFET manufactured according to the first embodiment. The horizontal axis represents the TSD density of the substrate measured by X-ray topography and the vertical axis represents the leak current density when a voltage of 200 V is applied to the device.

As depicted in FIG. 3, using the manufacturing method described in the first embodiment, devices were manufactured as Example A in which the $n^+$ source region 7 was doped with phosphorous (P) by ion implantation, and Example B in which arsenic (As) was used for the $n^+$ source region 7. The manufactured devices were each evaluated. For each of Examples A and B, trench formation was not performed to eliminate potential effects of the process of forming the trenches.

In Example A whose $n^+$ source region 7 was ion implanted with P, large leak current flowed regardless of the TSD area density while in Example B in which As was used in the $n^+$ source region 7, an improved effect was observed in that the leak current value was significantly reduced.

It is conceivable that the reduced leak current effect is attributed to the tendency of P and As to each diffuse in a dislocation. It is conceivable that P diffused in dislocations or near dislocations to inverse the epitaxial-formed p-type wide-bandgap layer 6, forming a leak path.

The inventors further investigated the effects of varying the impurity concentration of the p-type wide-bandgap layer 6 on the leak current. For example, trial devices were similarly manufactured for cases where the Al concentrations of the p-type wide-bandgap layer 6 were $3.0\times10^{18}$ $cm^{-3}$, $1.0\times10^{18}$ $cm^{-3}$, and $3.0\times10^{17}$ $cm^{-3}$. Only for the case of $3.0\times10^{18}$ $cm^{-3}$, a defect of a high threshold voltage Vth and an increase of the on-resistance RonA per unit area were observed and, for the cases of $1.0\times10^{18}$ $cm^{-3}$ and $3.0\times10^{17}$ $cm^{-3}$, no such defect was observed.

Effects of the implantation dose amount of As were similarly investigated. For example, trial devices were manufactured setting the peak concentration of BOX implantation to be $1.0\times10^{17}$ $cm^{-3}$, $1.0\times10^{18}$ $cm^{-3}$, $1.0\times10^{19}$ $cm^{-3}$, and $5.0\times10^{20}$ $cm^{-3}$ when As was ion-implanted. It was confirmed for all these devices that the leak current was equal to or lower than $1\times10^{-6}$ $A/cm^2$ though the device whose As peak concentration was $1.0\times10^{17}$ $cm^{-3}$ presented significantly increased contact resistance. It was determined that this device was unsuitable as a practical device.

In a second embodiment, a MOSFET is described that has substantially the same configuration and that is manufactured using substantially the same manufacturing method as those of the first embodiment, however, the ion implantation sessions for the MOSFET were executed using As for a position deep from the surface side of the element and using P for other positions.

"As" present at the deep position provides a structure with which an effect of preventing diffusion of P from the surface side of the element may be expected. The ion implantation time period may be improved by reducing the ion implantation amount (the number of stages) as follows for As whose beam current is difficult to secure. For example, when As is used only for the implantation for the greatest depth of five-stage implantation and P is used in the remaining four stages, an improved effect is achieved in that the process time period may be reduced by about several tens of minutes per one lot based on the difference in the acquisition amount of the beam current. In addition, reduction of the process time period of the As ion implantation may be facilitated since the As ion implantation may be used together with the P implantation, which is widely used in general.

In a third embodiment, a structure is employed where only a region of the $n^+$ source region determining the channel is formed using ion implantation of P and regions other than this region are formed by implantation of As. In general, when the position of a generated leak is identified, it has been confirmed that a TSD generated in a portion whose device structure has $n^{++}>p^+>n^+$ established from the surface side is the cause of the leak. The impurity concentrations in this case are, for example, $n^{++}$: about $3.0\times10^{19}$ cm$^{-3}$, $p^+$: about $1.0\times10^{18}$ cm$^{-3}$, and $n^+$: about $3.0\times10^{18}$ cm$^{-3}$.

For the device having the trench structure as described in the first embodiment, the gate channel width is also defined at the step of forming the $n^+$ source region 7 and as a result, to reduce the channel length, the acceleration energy of the ion implantation has to be increased. However, generally, the beam current of As is difficult to secure compared to the beam current of P as to the structure of the ion implantation apparatus. In addition, the range of P is short in SiC because the atomic radius of P is large compared to that of As.

Figure 4:
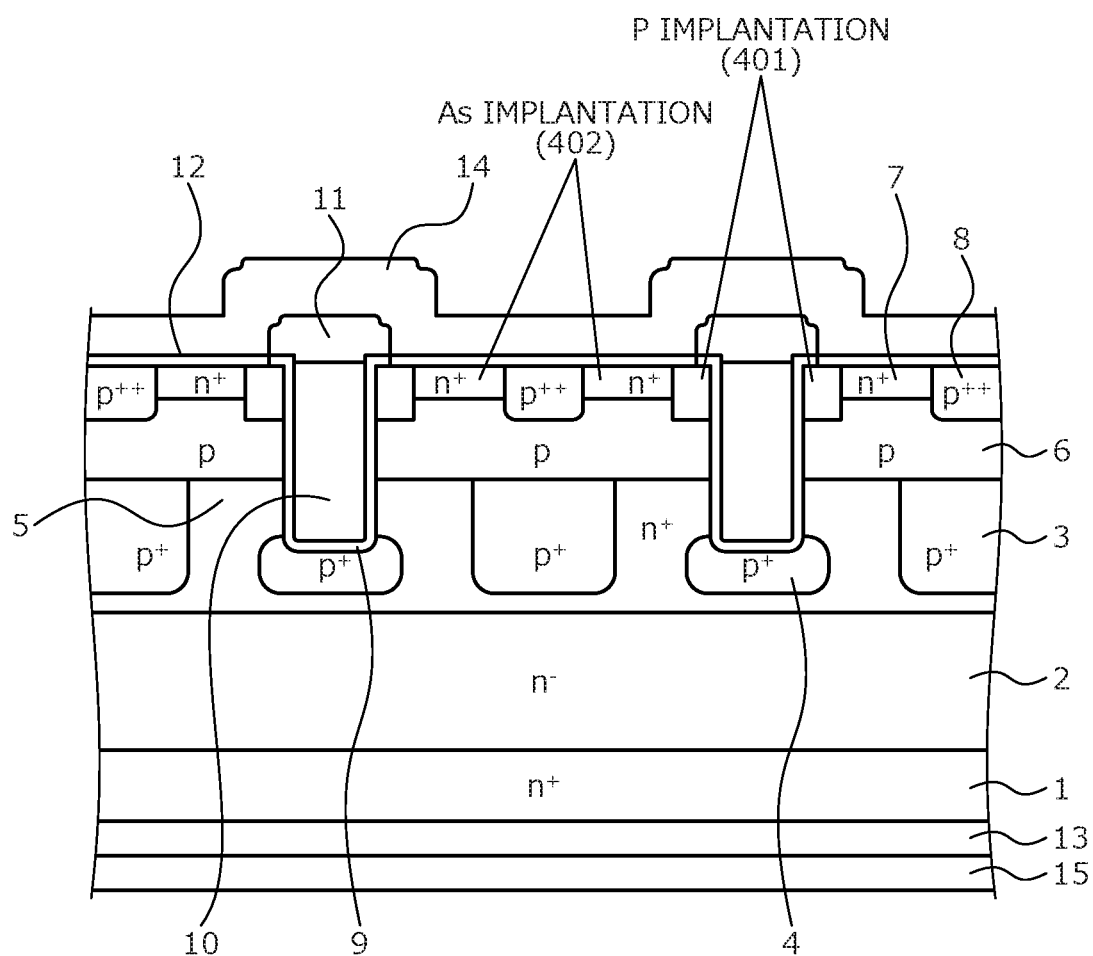
FIG. 4 is a cross-sectional view of a configuration of a silicon carbide semiconductor device according to a third embodiment.

FIG. 4 is a cross-sectional view of a configuration of a silicon carbide semiconductor device according to a third embodiment. In FIG. 4, although the basic structure of the third embodiment is same as that of the first embodiment (see FIG. 1), the third embodiment differs from the first embodiment in that that a structure is employed where only a region of the $n^+$ source region 7 determining the channel is formed using implantation 401 of P ions and other regions of the $n^+$ source region 7 are formed by implantation 402 of As in the third embodiment because of the situation such as the above restriction on the ion implantation.

The structure of the third embodiment has a feature in that the p base region 4 is present directly beneath the $n^+$ source region 7 to which P is applied. Even when P, which is considered to be the cause of the leak current, diffuses in the defects present at this position, the portion of the p base region 3 is not inversed thereby and no leak path is formed.

The range of P is longer than that of As and P may be implanted deeper than As even with the same acceleration energy. As a result, the channel length may be designed to be short. The channel length varies depending on the film thickness of the p-type wide-bandgap layer 6 and for the devices manufactured here, the channel length was 0.85 μm with only the As implantation and in contrast, the channel length could be reduced to 0.70 μm by using P that was implanted deeply.

Because SiC tends to prevent diffusion of impurities therein, in general, an impurity layer is not formed by using any process using diffusion but rather by implanting a dopant by ion implantation in multiple stages. As a result, a manufacturing load is applied to the ion implantation apparatus and reduction of the lead time is strongly demanded. The roles of the layer implanted with As implanted include formation of an ohmic contact and formation of a channel, and the former needs a high concentration while the latter only needs a relatively low concentration. In the fourth embodiment, for the concentration profile of As, an improvement was executed to set the concentration to be high on the surface side and to gradually decrease in the depth direction.

Figure 5:
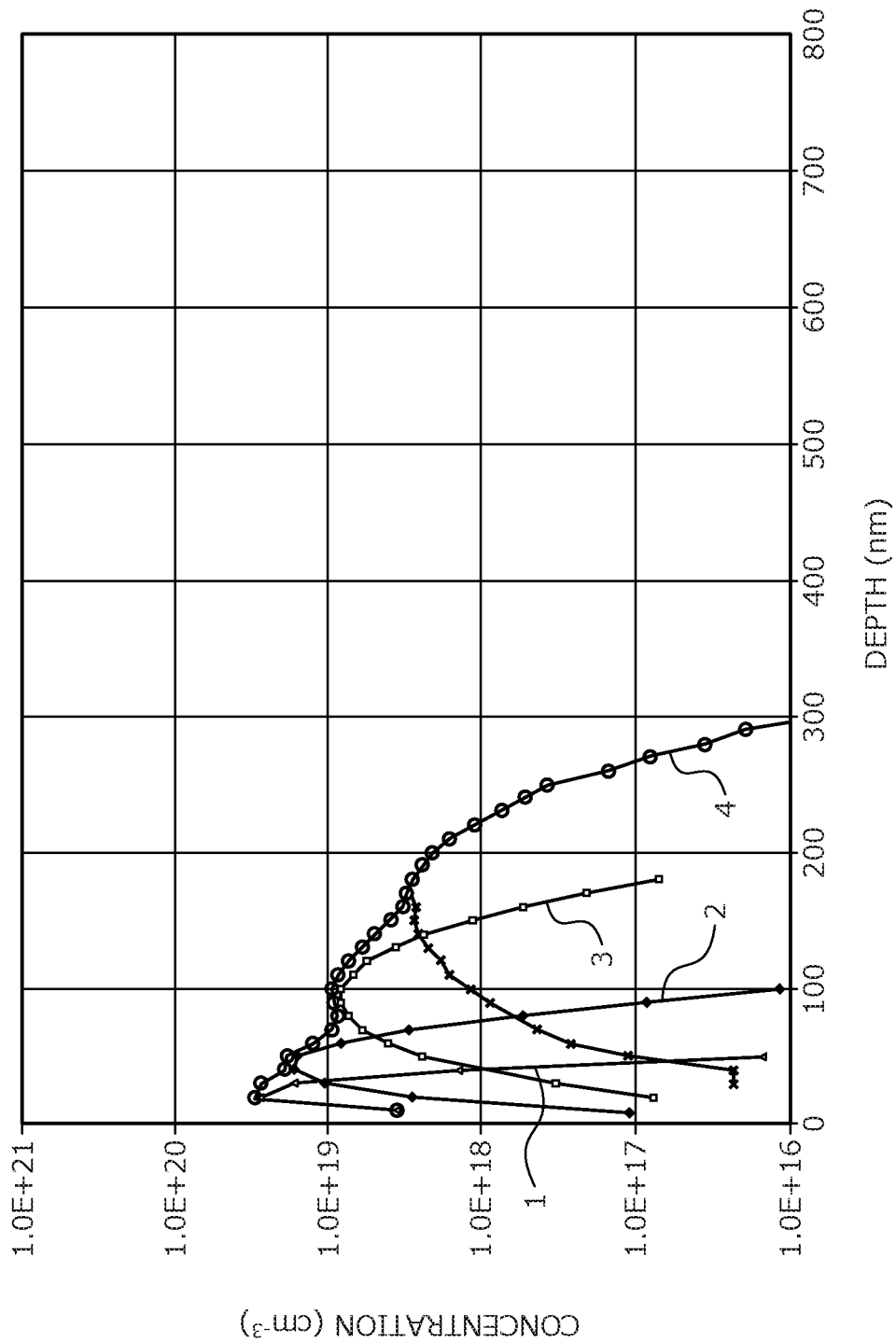
FIG. 5 is a graph of concentration profiles of As of a silicon carbide semiconductor device according to a fourth embodiment.

FIG. 5 is a graph of concentration profiles of As of the silicon carbide semiconductor device according to a fourth embodiment. The horizontal axis represents the depth from the first main surface side, and the vertical axis represents the doping concentration. In the example depicted in FIG. 5, a device was produced to have a profile whose concentration in the top surface was set to be $3.0\times10^{19}$ cm$^{-3}$, decreasing in the depth direction. For example, the implantation sessions were executed with the conditions of the acceleration energy to be 350 keV and the dose amount to be $3.3\times10^{13}$ cm$^{-2}$ for the first stage, the acceleration energy to be 200 keV and the dose amount to be $6.0\times10^{13}$ cm$^{-2}$ for the second stage, the acceleration energy to be 80 keV and the dose amount to be $6.0\times10^{13}$ cm$^{-2}$ for the third stage, and the acceleration energy to be 30 keV and the dose amount to be $5.0\times10^{13}$ cm$^{-2}$ for the fourth stage.

For the concentration profile of As, a concentration profile suitable for the formation of the ohmic contact and the channel may be established, the manufacturing load on the ion implantation apparatus may be reduced, and the lead time may be reduced, by the As profile whose concentration is set to be high on the surface side and gradually decrease in the depth direction.

In a fifth embodiment, only As is implanted in the $n^+$ source region 7 while an increase of the implantation depth is aimed at without increasing the acceleration energy for the ion implantation. Implantation of As is therefore executed at the concentration of $3.0\times10^{19}$ cm$^{-3}$ from the top surface side of the $n^+$ source region 7 and implantation is executed at the concentration of $3.0\times10^{20}$ cm$^{-3}$ with the highest acceleration (for example, 350 keV).

FIG. 6 is a graph of concentration profiles of As of the silicon carbide semiconductor device according to the fifth embodiment. With the As implantation according to the fifth embodiment, the As profile presents a profile that increases starting from the top surface side in the depth direction and as a result, the depth from the top surface of the p/n interface with the p-type wide-bandgap layer 6 may be set to be large whereby a reduction of the channel length and improvement of the device characteristics may be expected. For example, the implantation sessions were executed with the conditions of the acceleration energy to be 350 keV and the dose amount to be $3.3\times10^{15}$ cm$^{-2}$ for the first stage, the acceleration energy to be 80 keV and the dose amount to be $6.0\times10^{13}$ cm$^{-2}$ for the second stage, and the acceleration energy to be 30 keV and the dose amount to be $2.0\times10^{13}$ cm$^{-2}$ for the third stage.

Regarding the second to the fifth embodiments, similar to the first embodiment, the effect was confirmed that leak current could be reduced in the structure having the source region formed by ion implantation in the SiC substrate including defects. A device grade 3-inch substrate generally available commercially was used as the 4H—SiC substrate used in each of the first to the fifth embodiments. When measurement was executed for these substrates, variation was observed for the TSD density in the substrate surfaces. For example, the TSD densities at 200 points (each point being an area of 3 mm×3 mm) randomly measured from different wafers included those at a several/cm$^2$ level and a large number of those at a 3,000/cm$^2$ level. Nonetheless, by applying the structures described in the first to the fifth embodiments, the device may be manufactured without generating any defects caused by leak current even when a substrate at any level is used.

It should be considered that the embodiments are only examples in all respects and are not restrictive. The scope of the present invention is represented not by the above description but by the appended claims and it is intended that all changes in the meaning and the scope equivalent to the appended claims are included in the scope of the present invention. For example, the present invention is applicable to an IGBT that has a p-type region provided in the rear surface of the $n^+$-type silicon carbide substrate 1.

According to the described configuration, the n-type semiconductor region includes arsenic on the p-type silicon carbide region whose impurity concentration is equal to or lower than $1.0\times10^{18}$ cm$^{-3}$ and generation of leak current be suppressed even when a SiC substrate is used that includes a TSD, which is a factor of leak current.

According to the silicon carbide semiconductor device and the method of manufacturing a silicon carbide semiconductor device of the present invention, an effect is achieved in that a silicon carbide semiconductor device with suppressed generation of leak current may be realized even when a SiC substrate is used that includes a TSD, which is a factor of leak current.

As described above, the silicon carbide semiconductor device according to the present invention is useful for high-voltage semiconductor elements used in power converting equipment, a power source device such as in various industrial machines, or the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   an n-type silicon carbide substrate;
   a p-type silicon carbide region provided on the n-type silicon carbide substrate and having an impurity concentration equal to or lower than $1.0 \times 10^{18}$ cm$^{-3}$; and
   an n-type semiconductor region that is a source region or an emitter region, that is disposed in at least a region of an upper portion of the p-type silicon carbide region provided on the n-type silicon carbide substrate, and that consists of a first portion that contains ion implanted arsenic having an ion implanted arsenic concentration ranging from $1.0 \times 10^{19}$ cm$^{-3}$ to $5.0 \times 10^{20}$ cm$^{-3}$, which is effective to suppress leakage current, and a second portion that contains phosphorous.

2. The silicon carbide semiconductor device according to claim 1, wherein the p-type silicon carbide region is an epitaxial region.

3. The silicon carbide semiconductor device according to claim 1, wherein the n-type semiconductor region has an arsenic concentration in the first portion that is high on a surface side and tends to decrease in a depth direction.

4. The silicon carbide semiconductor device according to claim 1, wherein the n-type semiconductor region has an arsenic concentration in the first portion that is low on a surface side and tends to increase in a depth direction.

5. The silicon carbide semiconductor device according to claim 1, wherein the n-type silicon carbide substrate has a threading screw dislocation and the n-type semiconductor region is disposed on the threading screw dislocation.

6. The silicon carbide semiconductor device according to claim 1, wherein the n-type silicon carbide substrate has a threading screw dislocation which has an area density ranging from 1/cm$^2$ to 3000/cm$^2$.

7. The silicon carbide semiconductor device according to claim 1, wherein the silicon carbide semiconductor device is a vertical MOSFET, the p-type silicon carbide region is a channel region, and the n-type semiconductor region is a source region.

8. The silicon carbide semiconductor device according to claim 7, wherein the silicon carbide semiconductor device is a trench MOSFET.

9. The silicon carbide semiconductor device according to claim 1, wherein the silicon carbide semiconductor device is a vertical IGBT, the p-type silicon carbide region is a channel region, and the n-type semiconductor region is an emitter region.

10. The silicon carbide semiconductor device according to claim 9, wherein the silicon carbide semiconductor device is a trench IGBT.

11. A method of manufacturing a silicon carbide semiconductor device, the method comprising:
    providing an n-type silicon carbide substrate;
    forming a p-type silicon carbide region on the n-type silicon carbide substrate; and
    forming an n-type semiconductor region that is a source region or an emitter region in at least a region of an upper portion of the p-type silicon carbide region, the n-type-semiconductor region consisting of a first portion that contains ion implanted arsenic having an arsenic concentration ranging from $1.0 \times 10^{19}$ cm$^{-3}$ to $5.0 \times 10^{20}$ cm$^{-3}$, which is effective to suppress leakage current, and a second portion that contains phosphorous,
    wherein the p-type silicon carbide region is a plurality of p-type silicon carbide regions that are formed to have an impurity concentration equal to or lower than $1.0 \times 10^{18}$ cm$^{-3}$, and the n-type semiconductor region in the at least the region of the upper portion of the p-type silicon carbide region is formed by ion implantation using arsenic.

12. The method according to claim 11, wherein the p-type silicon carbide region is formed by an epitaxial growth method.

13. The method according to claim 11, wherein the n-type silicon carbide substrate has a threading screw dislocation and the n-type silicon carbide region is formed on the threading screw dislocation.

14. The method according to claim 13, wherein the threading screw dislocation has an area density ranging from 1/cm$^2$ to 3000/cm$^2$.

* * * * *